United States Patent
Hsi et al.

(10) Patent No.: US 6,859,026 B2
(45) Date of Patent: Feb. 22, 2005

(54) METHOD AND DEVICE FOR VERIFYING FREQUENCY OF CLOCK SIGNAL

(75) Inventors: Chen-Hua Hsi, Taipei (TW); Cheng-Yuan Wu, Taipei (TW); Chih-Hsien Weng, Taipei (TW)

(73) Assignee: Via Technologies, Inc. (TW)

( * ) Notice: Subject to any disclaimer, the term of this patent is extended or adjusted under 35 U.S.C. 154(b) by 55 days.

(21) Appl. No.: 10/624,750

(22) Filed: Jul. 22, 2003

(65) Prior Publication Data

US 2004/0155642 A1 Aug. 12, 2004

(30) Foreign Application Priority Data

Jul. 25, 2002 (TW) ..................................... 91116628 A

(51) Int. Cl.[7] ............................................. G01R 31/02
(52) U.S. Cl. .................................................. 324/76.52
(58) Field of Search ................................ 324/763, 765, 324/76.39, 76.41, 76.52, 76.77; 702/75, 106; 714/724, 731; 368/56, 200–201

(56) References Cited

U.S. PATENT DOCUMENTS

| | | | | |
|---|---|---|---|---|
| 3,737,766 A | * | 6/1973 | Lubarsky, Jr. ........... | 324/76.83 |
| 5,900,755 A | * | 5/1999 | Toeppen et al. ......... | 324/76.24 |
| 6,522,122 B2 | * | 2/2003 | Watanabe et al. ........ | 324/76.77 |
| 6,528,982 B1 | * | 3/2003 | Yanagisawa et al. .... | 324/76.77 |
| 6,737,852 B2 | * | 5/2004 | Soma et al. ............. | 324/76.74 |

* cited by examiner

*Primary Examiner*—David Zarneke
*Assistant Examiner*—Jermele Hollington
(74) *Attorney, Agent, or Firm*—Madson & Metcalf

(57) ABSTRACT

A device for verifying frequency of a clock signal generated from a clock signal generator includes a reference signal generator, a frequency divider and a comparative detector. A reference clock signal and a reset signal are provided by the reference signal generator. The frequency divider in communication with the reference signal generator and the clock signal generator receives and frequency-divides the clock signal into a bi-level divided clock signal in response to the reset signal. Then the comparative detector in communication with the frequency divider and the reference signal generator detects a level of the bi-level divided clock signal in response to the reset signal and the reference clock signal, and verifies frequency of the clock signal according to a period deviation range Te when the bi-level divided clock signal is detected to be a first level from the first to the (p−q)th detected points but a second level at the (p+1)th detected point.

17 Claims, 3 Drawing Sheets

METHOD AND DEVICE FOR VERIFYING FREQUENCY OF CLOCK SIGNAL

FIELD OF THE INVENTION

The present invention relates to a method and a device for verifying frequency of a clock signal, and more particularly to a method and a device for verifying frequency of a clock signal for testing an integrated circuit.

BACKGROUND OF THE INVENTION

Clock signals are essential to the coordination of various circuits. When an electronic device is produced, a series of test procedures need to be done to verify the electronic device. The test procedures, of course, should include the verification of a clock signal generator. The clock signal generator 10, which is generally an oscillator or a phase-locked loop circuit, is used to provide clock signals. Please refer to FIG. 1. A conventional device for testing the clock signals includes a frequency divider 11 and a detector 12. Since the generated clock signal Sc has a relatively high frequency, the frequency thereof is reduced by means of the frequency divider 11 and converted into a tested signal St with a divided switching frequency. The tested signal St is further sent into the detector 12 to be tested.

So far, the test procedure of the tested signal St has been only focused on the switching states of the tested signal St between two levels, i.e. a high level and a low level. That is to say, the detector 12 can only test if the tested signal St is normally switched either from the low level to the high level or from the high level to the low level, and no further check is made.

With increasing demand of high operating speed of circuits, it is important and necessary to verify accuracy of clock frequency. Therefore, it is required to perform further tests in order to verify accuracy.

SUMMARY OF THE INVENTION

It is an object of the present invention to a method and a device for verifying frequency of a clock signal so as to realize operating state and accuracy thereof.

A first aspect of the present invention relates to a method for verifying frequency of a clock signal. The clock signal has a first period T1 and the method comprises steps of: frequency-dividing the clock signal into a bi-level divided clock signal with a second period T2 in response to a reset signal, where T2/n=T1 and n is greater than unity; detecting a level of the bi-level divided clock signal at intervals of a period Ts in response to the reset signal; calculating a period deviation range Te of the clock signal when the bi-level divided clock signal is detected to be a first level from the first to the (p−q)th detected points but a second level at the (p+1)th detected point; and verifying frequency of the clock signal according to the period deviation range Te of the clock signal.

Preferably, the equations $p=T2/(2*Ts)$, $q=T1/Ts$, and $Te=(q+(\frac{1}{2}))*Ts/(n/2)$ are complied with.

Preferably, the period deviation range Te of the clock signal is calculated when the bi-level divided clock signal is detected to be the first level from the first to the (p−q)th detected points, to be the second level from the (p+1)th to the (2p−q) detected points, and to be the first level at the (2p+1) detected point, and the period deviation range Te is defined by a formula $Te=(q+(\frac{1}{2}))*Ts/n$.

Preferably, the period deviation range Te of the clock signal is calculated when the bi-level divided clock signal from the first to the (mp+1)th detected points are detected to be at predetermined levels, and the period deviation range Te is defined by a formula $Te=(q+(\frac{1}{2}))*Ts/(m*n/2)$, where m is a positive integer.

Preferably, the period Ts is a time period between two adjacent rising edges of a reference clock signal, and a level change of the reset signal occurs at a falling edge of the reference clock signal.

Preferably, Ts is no greater than T1.

A second aspect of the present invention relates to a method for verifying frequency of a clock signal generated from a clock signal generator. The clock signal has a first period T1. The method comprises steps of: frequency-dividing the clock signal into a bi-level divided clock signal with a second period T2 in response to a reset signal, wherein T2/n=T1, and n is a frequency-dividing parameter; detecting the bi-level divided clock signal in response to the reset signal and a reference clock signal having a third period Ts; and determining the clock signal generator to be in a normal operating state when a predetermined number m of continuous level changes of the bi-level divided clock signal all occur at specified ranges; and calculating a period deviation range Te of the clock signal according to a parameter q for defining the specified ranges, the third period Ts, the predetermined number m and the frequency-dividing parameter n when the clock signal generator is determined to be the normally operating state.

Preferably, $Te=(q+(\frac{1}{2}))*Ts/(m*n/2)$.

Preferably, rising and falling edges of the reset signal are consistent with a falling edge of the reference clock signal.

In an embodiment, a first and a second level changes of the bi-level divided clock signal occurs at specified ranges are determined when the bi-level divided clock signal is detected to be a first level from the first to the (p−q)th detected points, to be a second level from the (p+1)th to the (2p−q) detected points, and to be the first level at the (2p+1) detected point, where $p=T2/(2*Ts)$ and $q=T1/Ts$.

A third aspect of the present invention relates to a device for verifying frequency of a clock signal generated from a clock signal generator, comprises a reference signal generator for providing a reference clock signal and a reset signal; a frequency divider in communication with the reference signal generator and the clock signal generator, receiving and frequency-dividing the clock signal into a bi-level divided clock signal in response to the reset signal; and a comparative detector in communication with the frequency divider and the reference signal generator, detecting a level of the bi-level divided clock signal in response to the reset signal and the reference clock signal, and verifying frequency of the clock signal according to a period deviation range Te when the bi-level divided clock signal is detected to be a first level from the first to the (p−q)th detected points but a second level at the (p+1)th detected point.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
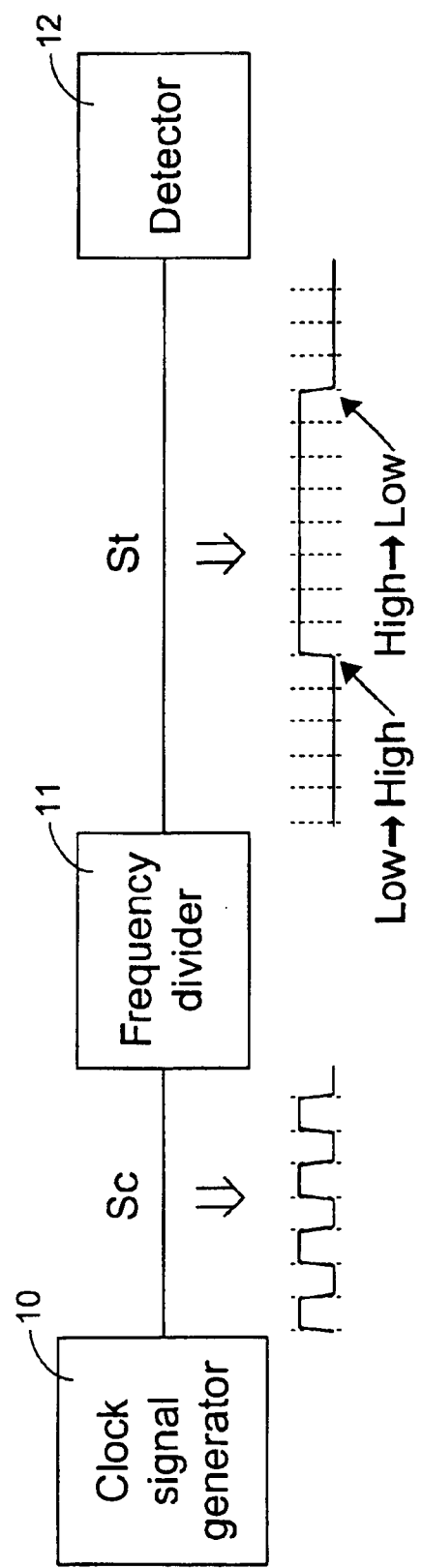
FIG. 1 is a block diagram of a conventional device for testing clock signals.
Figure 2:
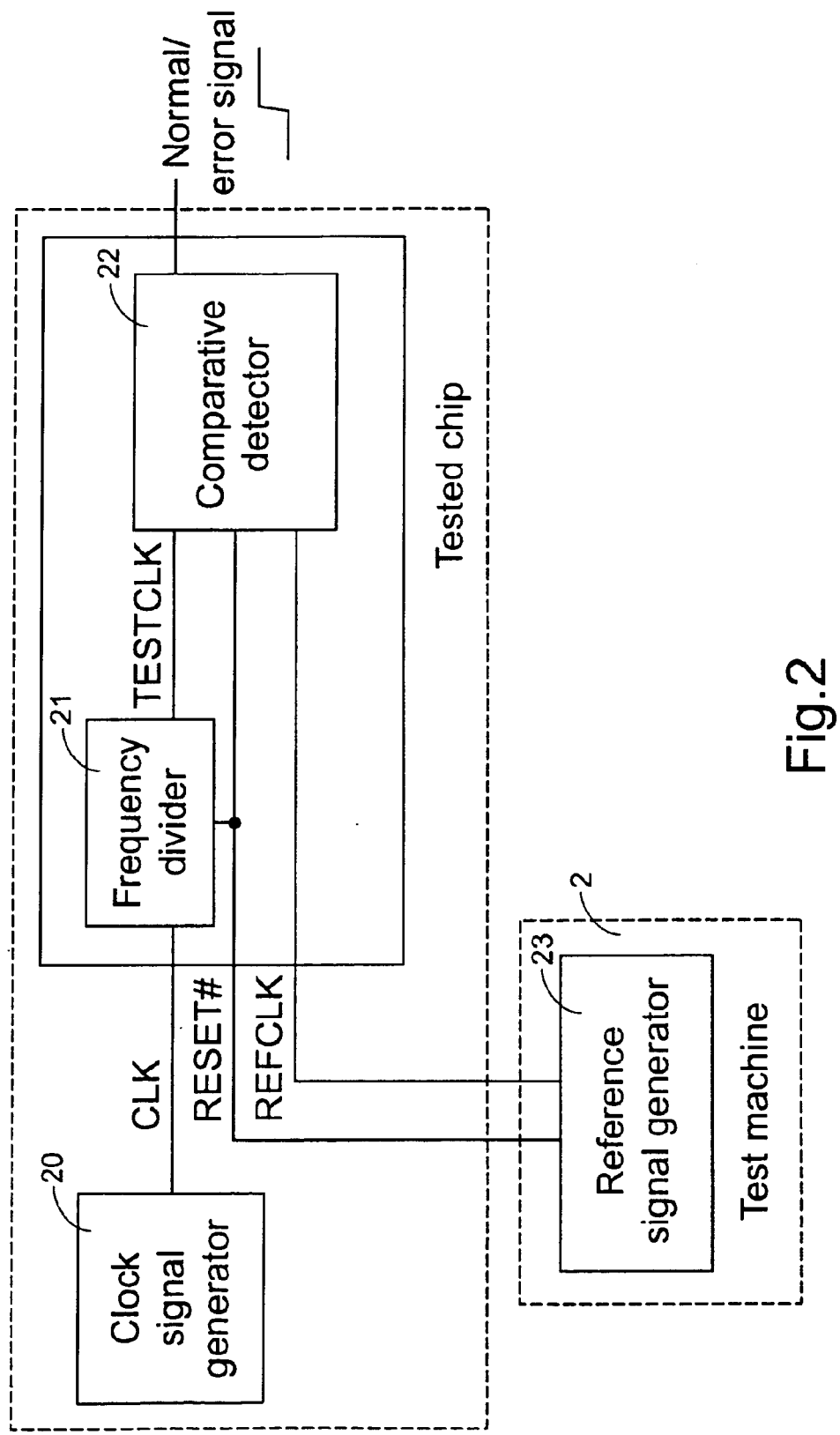
FIG. 2 is a block diagram of an embodiment of a device for testing and verifying frequency of clock signals according to the present invention.

Please refer to FIG. 2. A device capable of testing clock signals from a clock signal generator 20 and verifying frequency of the clock signals includes a frequency divider 21, a comparative detector 22 and a reference signal generator 23. In this embodiment, the reference clock generator 23 is a reference clock signal and reset signal generator disposed in a test machine 2. The frequency divider 21 in communication with the reference signal generator 23 and the clock signal generator 20 receives and frequency-divides a clock signal into a bi-level divided clock signal in response to the reset signal. Then, the comparative detector 22 in communication with the frequency divider 21 and the reference signal generator 23 detects a level of the bi-level divided clock signal in response to the reset signal and the reference clock signal. According to the detected level changes, whether the clock signal generator 20 is normally operated is determined and, simultaneously, whether the frequency of the clock signals generated from the clock signal generator 20 is accurate is verified. According to the present invention, the frequency of the clock signals is verified by calculating a period deviation range Te. An example is given hereinafter with reference to FIG. 3 to illustrate how the period deviation range Te is calculated.

It is assumed that the clock signal CLK generated from the clock signal generator 20 has a first period T1. After being frequency-divided with a parameter n, the bi-level divided clock signal has a second period T2, where T2/n=T1, and used as a tested clock signal TESTCLK to verify the state of the clock signal generator and the frequency of the clock signal. As described above, a reference clock signal REFCLK having a third period Ts and a reset signal RESET# are generated by the reference signal generator 23 of the test machine 2 and referred by the frequency divider 21 and the comparative detector 22. In this embodiment, the rising edge of the reset signal RESET# is consistent with the falling edge of the reference clock signal REFCLK, and the tested clock signal TESTCLK is frequency-divided in response to the reset signal RESET#. The levels of the tested clock signal TESTCLK are detected in response to the reset signal RESET# and the rising edges of the reference clock signal REFCLK. In other words, after the reset signal is de-asserted, the levels of the tested clock signal TESTCLK are detected at an internal of the third period Ts.

Figure 3:
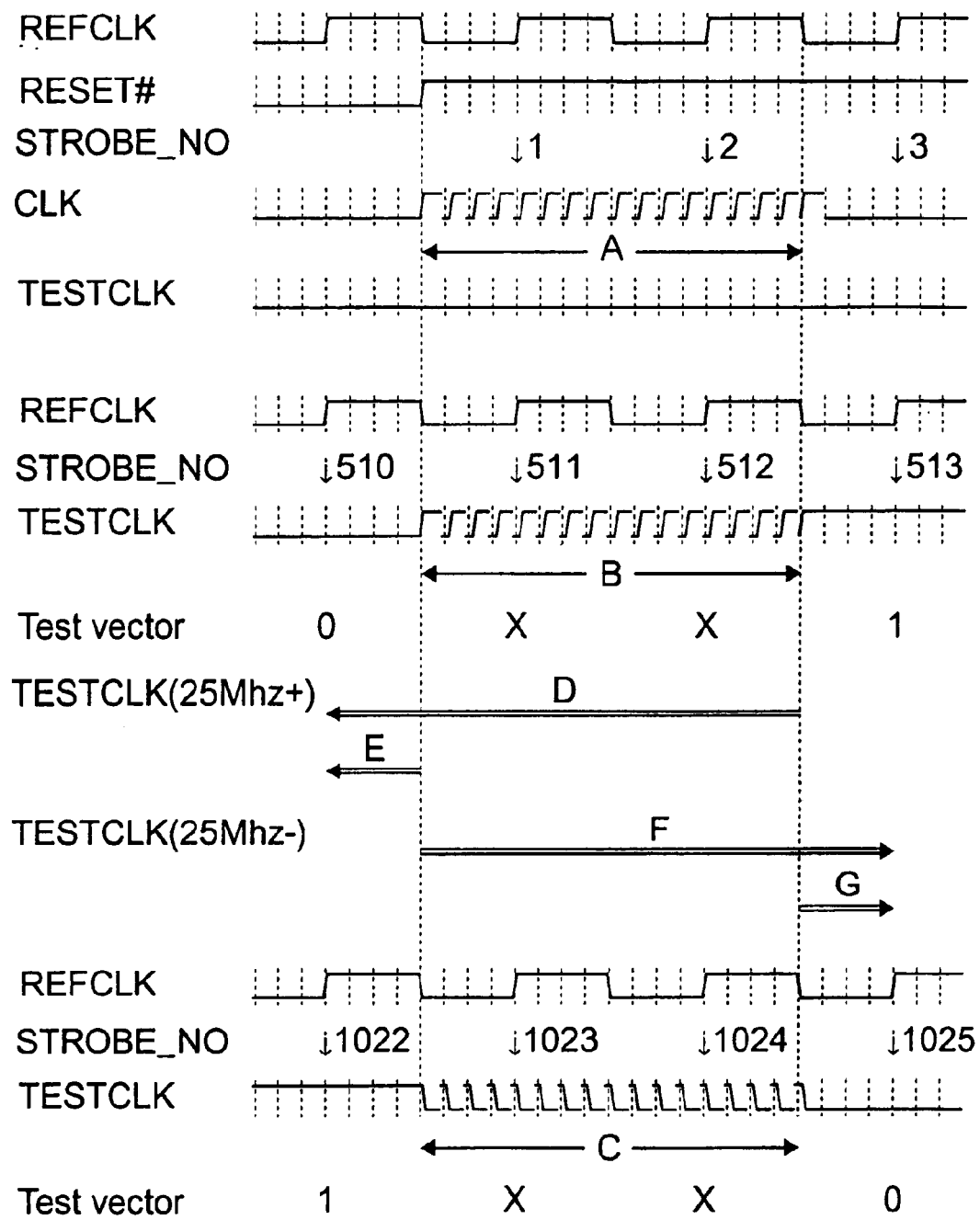
FIG. 3 is a waveform diagram illustrating signals associated with a method for testing clock signals according to the present invention.

When the tested clock signal is detected to be a first level, e.g. high level as shown in FIG. 3, from the first to the (p−q)th detected points but a second level at the (p+1)th detected point, it is determined that the tested clock signal passes the verification about the level-switching requirement in this determination cycle. Otherwise, the comparative detector 22 will output an error signal. While the parameter p is used for defining the range for performing this determination cycle, the parameter q defines the possible deviation range in detection cycles for a normal clock signal to change its level-state. It is understood that the possible deviation range is present because the clock signal CLK is not synchronized with the reference clock signal REFCLK. Accordingly, the clock signal CLK is possibly switched from a low level to a high level at any time within a period of time A indicated in FIG. 3. Since the level of the tested clock signal changes twice, i.e. low to high and high to low, in one cycle, and both of the rising and falling edges can be used as a detection cycle to realize whether the level-change state of the clock signal is normal, the value p is preferably defined by T2/(2Ts), and q is preferably defined by T1/Ts. Under this circumstance, the period deviation range Te is defined by $Te=(q+(1/2))*Ts/(n/2)$.

Depending on the required accuracy, more than one determination cycles can be performed. For example, the first determination cycle for determining whether the level of the tested clock signal is properly changed from a low level to a high level is performed with the first (p+1) detected points, and the second determination cycle for determining whether the level of the tested clock signal is properly changed from a high level to a low level is performed with the (p+1)th~(2p+1)th detected points. In other words, the tested clock signal is determined to pass the verification when the tested clock signal is detected to be the first level from the first to the (p−q)th detected points, to be the second level from the (p+1)th to the (2p−q) detected points, and to be the first level again at the (2p+1) detected points. In this example, the parameters are defined by $p=T2/(2*Ts)$, $q=T1/Ts$, and $Te=(q+(1/2))*Ts/n$. Likewise, for m determination cycles where m is a positive integer, i.e. m occurrences of level changes, the period deviation range Te of the clock signal can be calculated when the tested clock signal from the first to the (mp+1)th detected points are detected to be at predetermined alternate levels as mentioned above. Under this circumstance, the period deviation range Te is defined by a formula $Te=(q+(1/2))*Ts/(m*n/2)$.

Assuming in more detail that the first period T1 of the original clock signal CLK is 40 ns (frequency is 25 MHz), the third period Ts of the reference clock signal REFCLK is 20 ns, and the frequency dividing parameter n is 512 (the frequency divider 21 is a nine-bit divider), the second period T2 of the tested clock signal TESTCLK will be 40*512, and the parameters p and q are equal to 512 and 2, respectively. Therefore, ideally, the first occurrence of the rising edge of the tested clock signal TESTCLK is supposed to be within the period of time B (40 ns), and the first occurrence of the falling edge of the tested clock signal TESTCLK is supposed to be within the period of time C (40 ns). In other words, the levels from the first to the $510^{th}$ detected points should be low and the levels from the $513^{th}$ to the $1022^{th}$ detected points should be high. Likewise, the level at the $1025^{th}$ detected point should be low again.

For a perfectly stable clock signal CLK with the desired frequency 25 MHz, the above level-change states are definitely complied with. Therefore, signals indicative of normal operation of the clock signal generator 20 are continuously outputted by the comparative detector 22. If the frequency of the clock signal CLK is slightly higher than 25 MHz, the rising and falling edges of the tested clock signal TESTCLK will be shifted leftward compared to the one shown in FIG. 3. After a number of state-switching cycles, the leftward shift would be more and more significant. For example, after m state-switching cycles, i.e. m continuous level changes of the tested clock signal TESTCLK, the rising edge of the tested clock signal TESTCLK is shifted to a position aligning with the $510^{th}$ detected point, as indicated by the arrow D (shift with 50 ns). Accordingly, in spite the first determination cycle complies with the rule, i.e. the levels of the first to the $510^{th}$ detected points are low and the level of the $513^{th}$ detected point is high, the rule will not be complied with in next determination cycle due to the further shift. Therefore, even if the clock signal CLK is stably switched between high and low levels, the inaccuracy of the frequency of the clock signal can be found. In this case, the real period of the clock signal CLK can be estimated to be $40-[50/(m*511/2)]$ ns, and the frequency can also be obtained as a reciprocal of the period. Likewise, in another example that the rising edge of the tested clock signal TESTCLK is shifted to a position aligning with the $510^{th}$ detected point after m' state-switching cycles, as indicated by the arrow E (shift with 10 ns), the real period of the clock signal CLK can be estimated to be 40−[10/(m'*512½)] ns, and the frequency can also be obtained as a reciprocal of the period.

The similar derivation can be applied in the situation that the frequency of the clock signal CLK is slightly lower than 25 MHz. The rising and falling edges of the tested clock signal TESTCLK will be shifted rightward compared to the one shown in FIG. 3. After a number of state-switching cycles, the rightward shift would be more and more significant. For example, after m state-switching cycles, the rising edge of the tested clock signal TESTCLK is shifted to a position aligning with the $513^{th}$ detected point, as indicated by the arrow F (shift with 50 ns). Accordingly, in spite the first determination cycle complies with the rule, i.e. the levels of the first to the $510^{th}$ detected points are low and the level of the $513^{th}$ detected point is high, the rule will not be complied with in next determination cycle due to the further shift. Therefore, even if the clock signal CLK is stably switched between high and low levels, the inaccuracy of the frequency of the clock signal can be found. In this case, the real period of the clock signal CLK can be estimated to be 40+[50/(m*512½)] ns, and the frequency can also be obtained as a reciprocal of the period. Likewise, in another example that the rising edge of the tested clock signal TESTCLK is shifted to a position aligning with the $513^{th}$ detected point after m' state-switching cycles, as indicated by the arrow G (shift with 10 ns), the real period of the clock signal CLK can be estimated to be 40+[10/(m'*512½)] ns, and the frequency can also be obtained as a reciprocal of the period.

It is understood that the two examples mentioned above are in boundary conditions. Therefore, while the obtained frequency being between 1/{40+[10/(m*512½)]} and 1/{40−[10/(m*512½)]} will be determined as an absolutely accurate frequency range Fc of the clock signal CLK, the obtained frequency beyond the range between 1/{40+[50/(m*512½)]} and 1/{40−[50/(m*512½)]} will be determined as an absolutely inaccurate frequency range Fe of the clock signal CLK. For example, on the condition that the tested clock signal TESTCLK complies with the above-mentioned verifying rule after 4 state-switching cycles are detected, i.e. m=4, the absolutely accurate frequency range Fc is 25 MHz±244 ppm, and the absolutely inaccurate frequency range Fe covers the frequency range lower than 25 MHz−1222 ppm and the frequency range higher than 25 MHz+1222 ppm. On the other hand, it is verified that the frequency of the clock signal CLK lies within 25 MHz±1222 ppm.

In summary, the absolutely inaccurate frequency range Fe and the absolutely accurate frequency range Fc can be obtained by formulae of:

$$Fe = 1/[T1 \pm Te] = 1/[T1 \pm ((q+(½))*Ts/(m*n/2))]; \text{ and}$$

$$Fc = 1/[T1 \pm ((½)*Ts/(m*n/2))].$$

By substituting T1, Ts, q, m and n with 40, 20, 40/20, 4 and 512, the aforementioned data are obtained.

Of course, in a case that the accuracy of the clock signal is not very critically required, the possible deviation range q can be enlarged. In an example of q=3, the frequency of the clock signal CLK will be within 25 MHz±1706 ppm on the condition that T1, Ts, m and n are 40, 20, 4 and 512, respectively.

Based on the relationship among the reset signal RESET#, the reference clock signal REFCLK and the clock signal CLK, two means are applicable to function as the comparative detector 22. In the first embodiment, a register-transistor level (RTL) syntax is used to describe the comparative detector 22, and then converted into real circuit with a logic synthesis tool. It is advantageous due to the insertion of a real circuit into the IC to be tested, so that the IC can be verified by a self-detection procedure. In order to improve the detected frequency accuracy of the clock signal, more determination cycles are performed and more level changes are monitored. For example, if the value m is increased from 4 to 5 or more, more accurate clock frequency can be obtained. However, more complicated hardware will be required accordingly.

In the second embodiment, the comparative detector 22 is implemented by a test machine having been informed thereof the accurate test vector of the divided tested clock signal TESTCLK. The term "test vector" indicates an ideal value of the tested clock signal TESTCLK for each detected point. Accordingly, when the test machine receives the real tested clock signal TESTCLK from the frequency divider 21 and the ideal signal, i.e. the test vector, in response to the reference clock signal, the received signals are compared and verified.

To sum up, in addition to the determination of the switching states of the clock signal, the frequency accuracy of the clock signal can also be verified at the same time.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for verifying frequency of a clock signal, said clock signal having a first period T1, said method comprises steps of:

frequency-dividing said clock signal into a bi-level divided clock signal with a second period T2 in response to a reset signal, where T2/n=T1 and n is greater than unity;

detecting a level of said bi-level divided clock signal per predetermined period Ts in response to said reset signal;

calculating a period deviation range Te of said clock signal when said bi-level divided clock signal is detected to be a first level from the first to the (p−q)th detected points but a second level at the (p+1)th detected point; and verifying frequency of said clock signal according to said period deviation range Te of said clock signal.

2. The method according to claim 1 wherein p=T2/(2*Ts), q=T1/Ts, and Te=(q+(½))*Ts/(n/2).

3. The method according to claim 1 wherein said period deviation range Te of said clock signal is calculated when said bi-level divided clock signal is detected to be said first level from the first to the (p−q)th detected points, to be said second level from the (p+1)th to the (2p−q) detected points, and to be said first level at the (2p+1) detected point.

4. The method according to claim 3 wherein p=T2/(2*Ts), q=T1/Ts, and Te=(q+(½))*Ts/n.

5. The method according to claim 3 wherein said period deviation range Te of said clock signal is calculated when said bi-level divided clock signal from the first to the (mp+1)th detected points are detected to be at predetermined levels, and said period deviation range Te is defined by a formula Te=(q+(½))*Ts/(m*n/2), where m is a positive integer.

6. The method according to claim 1 wherein said predetermined period Ts is a time period between two adjacent rising edges of a reference clock signal, and a level change of said reset signal occurs at a falling edge of said reference clock signal.

7. The method according to claim 1 wherein Ts is no greater than T1.

8. A method for verifying frequency of a clock signal generated from a clock signal generator, said clock signal having a first period T1, said method comprising steps of:
   frequency-dividing said clock signal into a bi-level divided clock signal with a second period T2 in response to a reset signal, wherein T2/n=T1, and n is a frequency-dividing parameter;
   detecting said bi-level divided clock signal in response to said reset signal and a reference clock signal having a third period Ts; and
   determining said clock signal generator to be in a normal operating state when a predetermined number m of continuous level changes of said bi-level divided clock signal all occur at specified ranges; and
   calculating a period deviation range Te of said clock signal according to a parameter q for defining said specified ranges, said third period Ts, said predetermined number m and said frequency-dividing parameter n when said clock signal generator is determined to be said normally operating state.

9. The method according to claim 8 wherein $Te=(q+(½))*Ts/(m*n/2)$.

10. The method according to claim 8 wherein rising and falling edges of said reset signal are consistent with a falling edge of said reference clock signal.

11. The method according to claim 8 wherein a first and a second level changes of said bi-level divided clock signal occurs at specified ranges are determined when said bi-level divided clock signal is detected to be a first level from the first to the (p−q)th detected points, to be a second level from the (p+1)th to the (2p−q) detected points, and to be said first level at the (2p+1) detected point.

12. The method according to claim 11 wherein $p=T2/(2*Ts)$ and $q=T1/Ts$.

13. A device for verifying frequency of a clock signal generated from a clock signal generator, comprising:

a reference signal generator for providing a reference clock signal and a reset signal;

a frequency divider in communication with said reference signal generator and said clock signal generator, receiving and frequency-dividing said clock signal into a bi-level divided clock signal in response to said reset signal; and a comparative detector in communication with said frequency divider and said reference signal generator, detecting a level of said bi-level divided clock signal in response to said reset signal and said reference clock signal, and verifying frequency of said clock signal according to a period deviation range Te when said bi-level divided clock signal is detected to be a first level from the first to the (p−q)th detected points but a second level at the (p+1)th detected point.

14. The device according to claim 13 wherein $Te=(q+(½))*Ts/(n/2)$.

15. The device according to claim 13 wherein said comparative detector verifies frequency of said clock signal according to said period deviation range Te when said bi-level divided clock signal is detected to be said first level from the first to the (p−q)th detected points, to be said second level from the (p+1)th to the (2p−q) detected points, and to be said first level at the (2p+1) detected point, and said period deviation range Te is defined by a formula $Te=(q+(½))*Ts/n$.

16. The device according to claim 13 wherein said comparative detector verifies frequency of said clock signal according to said period deviation range Te when said bi-level divided clock signal from the first to the (mp+1)th detected points are detected to be at predetermined levels, and said period deviation range Te is defined by a formula $Te=(q+(½))*Ts/(m*n/2)$, where m is a positive integer.

17. The device according to claim 13 wherein said level of said bi-level divided clock signal is detected in response to said reset signal and a rising edge of said reference clock signal, and a level change of said reset signal occurs at a falling edge of said reference clock signal.

* * * * *